United States Patent [19]

Goodwin et al.

[11] Patent Number: 4,631,729
[45] Date of Patent: Dec. 23, 1986

[54] SEMICONDUCTOR LASER STRUCTURE

[75] Inventors: Frank E. Goodwin, Marina Del Rey; Hsiang-Yi D. Law, Agoura; Charles B. Morrison; Luis Figueroa, both of Torrance, all of Calif.

[73] Assignee: TRW Inc., Redondo Beach, Calif.

[21] Appl. No.: 556,879

[22] Filed: Dec. 1, 1983

[51] Int. Cl.$^4$ ............................................. H01S 3/19
[52] U.S. Cl. ......................................... 372/44; 372/48
[58] Field of Search ....................... 372/44, 48, 50, 43; 357/17

[56] References Cited

U.S. PATENT DOCUMENTS 4,255,717 3/1981
4,382,265 5/1983 Pearsall ................................. 372/44

Primary Examiner—William L. Sikes
Assistant Examiner—Robert E. Wise
Attorney, Agent, or Firm—Noel F. Heal

[57] ABSTRACT

A semiconductor laser array structure operable at relatively high powers and high brightness levels compared with prior laser arrays. At least two principal lasing regions are formed in a single active layer of the structure, and are closely coupled by an intermediate region in which there is optical gain. Preferably, the dimensions of the structure are selected to provide single-filament lasing in the principal lasing regions and in the intermediate region, resulting in a composite output that is apparently phase-locked and has a high-brightness, single-lobe far-field radiation distribution pattern with a low divergence angle. The disclosed structure uses gallium arsenide and gallium aluminum arsenide materials and is fabricated using liquid-phase epitaxy. Longitudinal mode selection in the device may be accomplished by configuring the two channels to produce different sets of longitudinal modes, the close coupling of the two regions resulting in the output of only those modes common to both regions.

24 Claims, 5 Drawing Figures

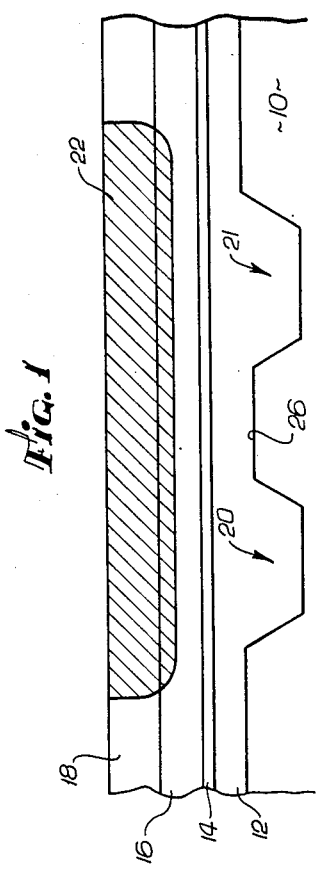
Fig. 1
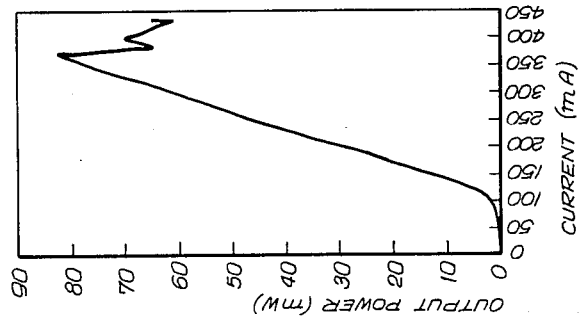
Fig. 2
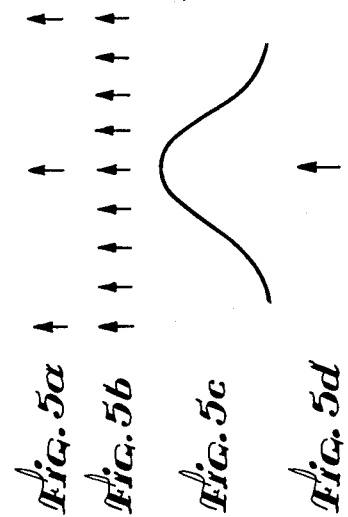
Fig. 4 FAR FIELD
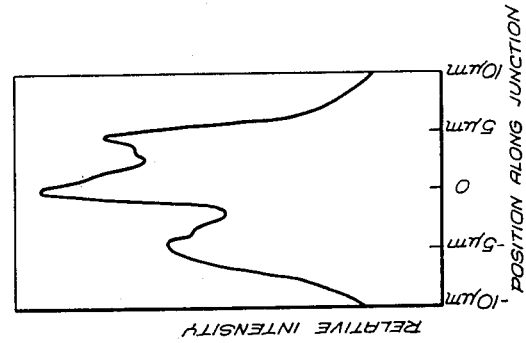
Fig. 3 NEAR FIELD
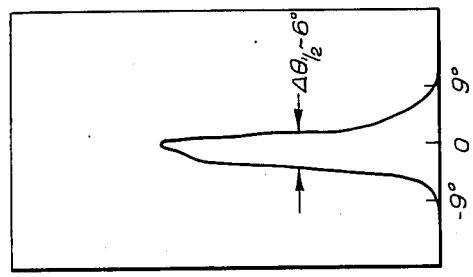
Fig. 5a
Fig. 5b
Fig. 5c
Fig. 5d

SEMICONDUCTOR LASER STRUCTURE

BACKGROUND OF THE INVENTION

This invention relates generally to semiconductor lasers, and more particularly, to laser structures in which multiple lasing elements are disposed in a single device to increase brightness and power output. There is currently an urgent need for semiconductor lasers having a peak power capability of one watt, a continuous-wave (CW) output of 100 milliwatts (mW), and a high brightness level. Previously demonstrated semiconductor lasers can emit CW powers of only about 40 mW from one laser facet with high brightness.

By way of background, the basic structure of a p-n junction laser includes an active layer of semiconductor material sandwiched between a p type material and an n type material. A pair of parallel faces of the structure perpendicular to the plane of the active layer, are cleaved or polished, and the remaining faces are roughened to eliminate lasing in directions other than the desired one. The entire structure is called a Fabry-Perot cavity. When a forward bias is applied across the junction, a current flows. Initially, at low currents, there is spontaneous emission of light in all directions. As the bias is increased, eventually a threshold current is reached at which stimulated emission occurs and a monochromatic and highly directional beam of light is emitted from the junction.

Although many different semiconductor laser geometries have been constructed or proposed, lasers of the double heterostructure type are probably the most widely used. In a double heterostructure (DH) laser, the active layer is sandwiched between two inactive layers that take the form of crystalline solid solutions, such as aluminum gallium arsenide ($Al_xGa_{1-x}As$, where x is the fraction of aluminum arsenide in the material. The DH laser has the advantage of being less temperature dependent and operating at a lower current density than a homostructure laser. Also the DH laser provides a greater difference in refractive index at the boundaries between the active and inactive layers, and therefore confines the light more effectively within the active layer.

Various efforts have been made to achieve high power and high brightness from semiconductor lasers, but have met with only limited success. A basic problem in this regard is that merely increasing the emission area of the lasing cavity is not necessarily effective to increase the brightness, because a relatively large cavity tends to operate in multiple spatial modes. In other words, the light source will include multiple lasing spots or filaments. Although more power may be consumed than in a smaller cavity, the light source is spread out among the multiple filaments, and the divergence angle of the resultant beam is increased. Hence the brightness, which is the power per unit source area per unit solid angle of the beam, may not be increased at all. Because merely increasing the size of the laser provides no solution, efforts have been directed to the design of devices with arrays of laser cavities having single-filament lasing properties.

One proposed solution takes the form of a phase-locked array of lasers, as described in U.S. Pat. No. 4,255,717 to Donald R. Scifres et al., entitled "Monolithic Multi-Emitting Laser Device." In this device, multiple lasing cavities are aligned closely together thereby achieving improvement in beam coherence and divergence properties. However, the brightness of such an array is not higher than that of a single laser of the same power, and the far-field light distribution pattern exhibits a twin-lobe shape that is characteristic of a 180-degree difference in phase between individual emitters in the array. The same is true of other multiple laser arrays, such as the one described by D. E. Ackley et al., "High Power Leaky-Mode Multiple-Stripe Laser," Appl. Phys. Lett., Vol. 39, p. 27 (1981).

Most semiconductor lasers employ a relatively narrow stripe of conductive material to make contact with one of the inactive layers, thereby confining the lasing action to the region aligned with the stripe. This structure is also employed in most laser arrays, multiple stripes being employed to define the multiple lasing regions. One exception to this is a CSP large optical cavity laser array device described by D. Botez, in the proceeding of the International Conference on Integrated Optics and Optical Fiber Communication, Paper 29B52, Tokyo, Japan (1983). The structure of this device includes a relatively wide stripe, in the form of a shallow zinc diffusion region, extending over all of the lasing cavities. However, the device is configured to provide high losses in the regions between laser cavites, so that the effect is still similar to that of an array of separate laser diodes.

Other types of laser arrays include the channeled-substrate-planar (CSP) laser, as described by K. Aiki et al., "Transverse Mode Stabilized $Al_xGa_{1-x}As$ Laser with Channeled Substrate Planar Structure," Appl. Phys. Lett., Vol. 30, p. 649 (1977). This and other similar array structures provide virtually no coupling between the array emitters, and therefore produce an array of lasing spots, each of which is up to 6 microns (micrometers) in width.

Another difficulty associated with semiconductor lasers is that it is sometimes difficult to maintain stable operation in a single desired longitudinal mode or wavelength. This is particularly true when a laser is modulated with a communications signal. Accordingly an ideal laser for communications applications is one that will maintain a desired longitudinal mode under all conditions.

It will be appreciated from the foregoing that there is still a great need for improvement in the field of semiconductor lasers. In particular, there is a need for a high-power laser that provides a high brightness level and a more desirable far-field pattern. Ideally, such a laser should also provide for stable operation in a single selected longitudinal mode. The present invention provides a novel solution to these needs.

SUMMARY OF THE INVENTION

The present invention resides in a multiemitter semiconductor laser structure operable at high power and high brightness levels, and having a far-field radiation distribution pattern with only a single central lobe. In its broadest sense, the novel structure of the invention includes at least two principal lasing regions that are closely coupled together by an intermediate region in which lasing action can also take place. Although the physical explanation for the improved performance of the device is not known in detail, it appears that by providing optical amplification in this intermediate region, the two principal lasing regions are not only closely spaced but are optically coupled in a desirable in-phase relationship.

Briefly, and in general terms, the semiconductor diode laser structure of the invention comprises a p type inactive semiconductor cladding layer, an n type inactive semiconductor cladding layer, an active semiconductor layer disposed between the p type and n type cladding layers, means defining at least two principal lasing regions in the active layer, and means defining an intermediate coupling region between the principal lasing regions. The principal lasing regions are laterally spaced and are in close enough proximity to provide close coupling between the regions. The structure also includes means for applying a bias voltage across the p type and n type layers in the principal lasing regions and in the intermediate lasing region, to produce optical amplification in the intermediate lasing region and emission of laser light from all three regions.

More specifically, the principal and intermediate lasing regions are preferably of such a width as to result in the production of only a single lasing filament in each region. In a presently preferred embodiment of the invention, the means defining the principal lasing regions include a semiconductor substrate on which the structure is formed and two laser channels formed in the substrate, to confine the lasing action in the principal lasing regions. The means defining the intermediate lasing region includes a substrate mesa between the channels, dimensioned to provide net optical amplification or gain in the intermediate lasing region.

In an illustrative embodiment of the invention, the stucture includes an n type gallium arsenide (GaAs) substrate, a first inactive cladding layer of n type gallium aluminum arsenide ($Ga_{0.65}Al_{0.35}As$) formed over the substrate, an active layer of p type gallium arsenide or gallium aluminum arsenide ($Ga_{0.94}Al_{0.06}As$) formed over the first inactive cladding layer, and a second inactive layer of p type gallium aluminum arsenide ($Ga_{0.65}Al_{0.35}As$) formed over the active layer. Before the first inactive cladding layer is formed, the substrate is etched to define at least two channels extending in a direction parallel to the direction of intended light emission from the active layer. These channels define the principal lasing regions and are similar to two channelled-substrate-planar (CSP) lasers. A top layer of n type gallium arsenide is formed over the second inactive layer, and a deep diffusion region of zinc is formed in the top layer, extending partially into the second inactive layer. The zinc diffusion region has a width that overlaps the two channels.

In accordance with a significant aspect of the invention, the two channels are separated by a mesa in the substrate material, the height of which is less than that of the substrate ledges on the opposite sides of the channels. The height of this mesa is chosen to provide sufficient thickness in the first inactive layer to yield a net optical gain or amplification in the intermediate region between the channels. In the presently preferred embodiment of the invention, the desired reduction in mesa height is obtained during a fabrication step in which the first inactive layer is formed. A liquid-phase epitaxy (LPE) process is used, and provides a "melt-back" of the mesa before the inactive layer is built up. The mesa, being of smaller width than the substrate ledges on the opposite sides of the channels, is melted back more than these ledges. The result is a mesa of decreased height, which is effective in reducing absorption losses in the intermediate lasing region. The somewhat higher substrate ledges on the other sides of the channels serve to contain the lasing within the principal lasing regions.

In the presently preferred form of the invention, the width of the channels and the width of the intermediate region between channels are selected to be approximately one diffusion length, so as to support only a single lasing filament. For a gallium aluminum arsenide laser, this width dimension is approximately in the range of 4–8 microns. For wider lasing regions, multi-filament lasing will occur, and the degree of coupling between channels will be lessened, although some advantage may still be obtained from the structure of invention.

Another aspect of the invention involves the use of multiple coupled lasing regions to provide a selected longitudinal mode of operation. One principal lasing region is defined to provide a different set of longitudinal modes from the other. Because the two regions are closely coupled, and regardless of whether or not the intermediate region provides a net optical gain, the composite of the lasing regions operates only in those modes that are common to both regions. By appropriate design of the principal lasing regions, the structure may be made to operate in a single desired longitudinal mode, which is stable even when the device is subject to modulation. In one embodiment of the invention, the lasing regions are designed to produce different longitudinal modes by varying the thickness of the active layer. This changes the effective refractive index of the layer and results in different longitudinal modes of operation. Alternatively, the lasing regions can be defined by channels of different dimensions.

It will be appreciated from the foregoing that the present invention represents a significant advance in the field of semiconductor lasers. In particular, the invention provides a laser output of high brightness and with a desirable single-lobe far-field pattern with good divergence properties. The same structure of the invention can also be employed to yield a single desired longitudinal mode of operation. Other aspects and advantages of the invention will become apparent from the following more detailed description, taken in conjunction with the accompanying drawings.

BRIEF DESCRIPTION OF THE DRAWINGS

FIG. 1 is a cross-sectional view of a twin-channel laser in accordance with the invention;

FIG. 2 is a graph showing the variation of output power with current, for a laser structure like that shown in FIG. 1;

FIG. 3 is a graph showing the near-field light distribution pattern for the same laser structure;

FIG. 4 is a graph showing the far-field light distribution pattern for the same laser structure; and FIGS. 5a–5d are diagrammatical representations showing, respectively, multiple longitudinal modes of a first laser cavity, multiple longitudinal modes of a second and different laser cavity, the gain-versus-wavelength profile of a laser structure, and a single longitudinal mode output from the structure.

DESCRIPTION OF THE PREFERRED EMBODIMENT

As shown in the drawings for purposes of illustration, the present invention is concerned with an improved semiconductor laser structure. Previous attempts to produce a laser or laser array having a high brightness level and a desirable far-field pattern have met with only limited success.

In accordance with the present invention, at least two principal lasing cavities are closely spaced and separated by an intermediate region having optical gain, resulting in a composite output of high brightness and a single-lobe far-field pattern with small divergence angles. In contrast with other laser arrays, the principal lasing regions in this device appear to be coupled in an in-phase relationship. The intermediate region between the principal lasing regions is structured to have reduced absorption losses and preferably to provide a net optical gain in the intermediate region.

FIG. 1 shows an illustrative embodiment of the invention, in the form of a twin-channel laser fabricated with liquid-phase epitaxy (LPE) techniques. The device includes a substrate of n or n+ type gallium arsenide, indicated by reference numeral 10, a first inactive cladding gallium layer layer 12 of n type gallium aluminum arsenide ($Ga_{0.65}Al_{0.35}As$), an active layer 14 of $Ga_{0.94}Al_{0.06}As$, a second inactive layer 16 of the same material as the first inactive layer 12, but of opposite polarity type, and a top layer 18 of n type gallium arsenide.

Prior to formation of the first inactive layer 12, the substrate 10 is etched to define two channels 20 and 21 extending the length of the device, i.e. in a direction perpendicular to the plane through which the cross section of FIG. 1 is taken. A deep diffusion region 22 of zinc forms a contact stripe having a width approximately corresponding to the combined widths of the two channels 20 and 21, and extending the full length of the device. The zinc diffusion region 22 extends partially into the second inactive layer 16.

In the illustrative embodiment, the channels 20 and 21 are each etched with a suitable etchant, such as a solution of sulfuric acid and hydrogen peroxide ($H_2SO_4$:$H_2O_2$:$H_2O$), to a depth of approximately 1.5 microns ($1.5 \times 10^{-6}$ meter) and a width of approximately 6 microns. The center-to-center spacing of the channels is approximately 8–10 microns.

In the illustrative embodiment of FIG. 1, the thickness of the active layer 14 is in the range 600–1,000 angstroms. The first inactive layer 12 is approximately 0.9 micron thick and the second inactive layer is approximately 1.8 microns thick. The top layer 18 is approximately 0.5 micron thick.

One of the dimensions that has to be selected and controlled with care to ensure proper operation of the structure in accordance with the invention, is the depth of the first inactive layer 12 in the intermediate region above the mesa 26 formed between the two channels 20 and 21. In structures of the prior art, the depth of the first inactive layer between lasing regions is made relatively thin to maximize absorption losses in the intermediate region, thereby ensuring isolation of the lasing regions. Because of the relative atomic bandgap energies of the active layer and the substrate materials, there is a tendency for light generated in the active layer near the intermediate region to be absorbed in the substrate material, if the first cladding inactive layer is thin enough.

The amount of the absorption loss in the intermediate region between the channels depends on the depth of the first inactive layer 12 and the depth of the active layer 14. The theoretical absorption losses for various layer dimensions have been documented in the technical literature. For example, K. Aiki et al. in "Transverse Mode Stabilized $Al_xGa_{1-x}As$ Injection Lasers with Channeled-Substrate-Planar Structure," IEEE J. Quant. Elect., Vol. QE-14, No. 2, p. 89 (1978), provide a graph in their FIG. 2(b) showing the relationship between absorption loss, the thickness of active layer and the thickness of first inactive layer.

With a knowledge of the threshold optical gain that a laser cavity can provide, one can determine from such a graph what the minimum thickness of the first inactive layer should be in order to achieve a net optical gain in the intermediate lasing region. The threshold gain is, of course, easily determinable from the length of the cavity, the reflectivity of its facets, and other parameters of the semiconductor material. For example, the threshold gain for gallium arsenide lasers is typically in the range 50–100 $cm^{-1}$. From the absorption loss curves discussed above, one can determine the thickness of the first inactive layer that will result in the same loss as the threshold gain. For gallium arsenide and an actone layer thickness of 600–1,000 angstroms, the minimum thickness of the first inactive layer is approximately 0.6 micron. The structure of the invention is preferably configured to provide at least this thickness in the intermediate region, to ensure a positive net optical gain in the intermediate region. For other materials and configurations, similar calculations may be made to determine the minimum thickness of the first inactive layer.

Not shown in FIG. 1, but needed for operation of the laser structure, is a conventional electrical contact adjacent to the zinc diffusion region 22 and another electrical contact beneath the substrate 10. For test purposes, the structure shown in FIG. 1 was soldered onto either a silicon or a diamond submount, which was then mounted onto a copper block to provide the substrate connection.

The output power in milliwatts (mW) obtainable from the structure is plotted in FIG. 2 as a function of injected current in milliamperes (mA). In the example shown, a maximum output power of 80 mW was reached before catastrophic damage occurred. Tests on a number of similar structures yielded maximum power figures of 50 mW or more. The power-current relationship is practically linear for both silicon-mounted and diamond-mounted structures.

It is well known that the threshold current of a semiconductor laser increases with temperature. Basically, the threshold current is a function of $T/T_0$, where T is the temperature and $T_0$ is a constant. For most conventional CSP lasers, $T_0$ is around 140–160 degrees C. However, the structure of the invention has a value of $T_0$ in the range 180–200 degrees C. Accordingly, the structure of the invention has reduced temperature dependence.

FIGS. 3 and 4 show the near-field and far-field radiation distribution patterns for the illustrative structure of the invention. The near-field pattern has three distinct lobes, apparently indicative of the twin channels and the intermediate region between the channels having optical gain. For reasons not entirely understood, the center lobe provides a higher intensity than the outer lobes that are apparently derived from the principal lasing regions in the channels. More importantly, the far-field pattern consists of only a single lobe centered at zero degrees. The half width of the far-field lobe is in the range of 4–6 degrees in a plane parallel with the active layer 14, and 25–35 degrees in the perpendicular plane.

The brightness, B, of a laser can be defined for a lossless system as:

$$B = (P_T 4\pi)/(\Omega \cdot A),$$

where:

$P_T$ = the optical power output from the laser,
$\Omega$ = the solid angle beamwidth in steradians,
and
A = the area of the lasing aperture.

Using experimental data obtained from a laser structure of the type described,
$P_T$ = 50 mW
$\Omega$ = 0.08 × 0.4 = 0.035 (approximately)
A = 10 microns × 2 microns,
B = 8.97 × 10$^{+7}$ watts/cm$^2$/steradian.

It is assumed that the solid angle beamwidth is given by the product of the half widths of the optical radiation pattern in planes parallel to an perpendicular to the laser diode junction. Similar calculations for a ten-element array of the prior art yield a brightness of only 6.18 × 10$^{+7}$ watts/cm$^2$/steradian, with 150 mW CW optical power.

In general, each principal lasing cavity is capable of producing a multiplicity of longitudinal modes separated by a wavelength displacement $\Delta\lambda$. $\Delta\lambda$ is given approximately by the expression:

$$\Delta\lambda = \frac{\lambda^2}{2N_{eff} \cdot L}$$

where
$\lambda$ = wavelength,
$N_{eff}$ = effective refractive index, and
L = length of cavity.

FIGS. 5a and 5b show diagrammatically the longitudinal modes associated two laser cavities. The longitudinal modes in FIG. 5b are spaced closer together than those in FIG. 5a, either because of differences in length or because of differences in effective refractive index. In accordance with one aspect of the invention, the effective refractive index is varied by fabricating the two channels of the structure to have active layers of different thicknesses. As the thickness of the active layer is reduced, the effective refractive index tends to approach the theoretical refractive index of the surrounding inactive layers, which is lower than the theoretical refractive index of the active layer. Therefore, varying the thickness of the active layer affords some degree of control over the longitudinal mode spacing.

Since the two laser channels are closely coupled by the intermediate region between the channels, only the modes supported by both channels will be produced by the composite device. The close coupling, in effect, results in a logical AND of the two sets of longitudinal modes. Superimposed on this composite mode output characteristic is the gain-wavelength profile of the structure, as shown in FIG. 5c. This profile further filters the output of the device, which may therefore be selected to take the form of a single selected longitudinal mode, as indicated in FIG. 5d. This mode selection effect may be obtained regardless of whether the intermediate region between the channels operates with a net optical gain, or whether lasing in the intermediate region is completely suppressed by appropriate selection of device dimensions. So long as there is close coupling between the two principal lasing regions, the structure will function to provide stable longitudinal mode selection.

Although the foregoing description has been in terms of a specific double heterostructure laser using gallium arsenide and gallium aluminum arsenide as materials, it will be understood that the principles of the invention are equally applicable to other semiconductor laser structures, using other materials. The number of semiconductor materials that exhibit laser action has continued to grow since a GaAs laser device was first demonstrated. At present, virtually all the lasing semiconductor materials have direct bandgaps. Various compound systems of materials from Groups III-V of the periodic Table are good candidates for laser materials. These may be ternary compounds of the type $A_xB_{1-x}C$, or quaternary compounds of the type $A_xB_{1-x}C_yD_{1-y}$, where A and B are Group III elements and C and D are Group V elements. Two important Group III-V compound solutions are $Al_xGa_{1-x}As_ySb_{1-y}$ and $Ga_xIn_{1-x}As_yP_{1-y}$. Group IV-VI compounds, such as PbS, PbTe, PbSe and related solid solutions, also exhibit laser action and may employ the invention to advantage. Just as the invention is not limited to any particular semiconductor materials, neither is it limited to any particular fabrication process. The LPE process used in fabrication of the illustrative embodiment of the invention has the advantage that it melts back the central substrate mesa to produce a desired optical gain in the intermediate region. However, the mesa may be reduced in height by other techniques, such as etching, and an entirely different fabrication process employed without departing from the invention in its broadest sense.

It will be appreciated from the foregoing that the present invention represents a significant advance in the field of semiconductor lasers. In particular, the structure of the invention is operable to provide an output of high power and high brightness, with a desirable single-lobe far-field pattern and small divergence angles. The structure of the invention may also be used to provide a stable single longitudinal output mode. Other advantages are its relatively low dependence on temperature, and its ease of fabrication using conventional planar epitaxial techniques, such as liquid-phase epitaxy.

It will also be appreciated that, although a specific embodiment of the invention has been described in detail for purposes of illustration, various modifications may be made, as discussed above, without departing from the spirit and scope of the invention. Accordingly, the invention is not to be limited except as by the appended claims.

We claim:

1. A semiconductor laser structure, comprising:
   an active semiconductor layer;
   means defining at least two principal lasing regions laterally spaced in said active layer, said means including at least two parallel lasing channels formed under said active semiconductor layer, to confine the lasing action to the principal lasing regions located adjacent to the channels, and wherein the two principal lasing regions are configured to produce different sets of longitudinal modes of output; and
   means for defining an intermediate coupling region between the principal lasing regions, to provide close coupling between the two principal lasing regions, resulting in a composite output from the structure that includes longitudinal modes common to both principal lasing regions, whereby said structure can be easily designed to operate in a single desired longitudinal mode.

2. A semiconductor laser structure as set forth in claim 1, wherein:
   said means for defining at least two principal lasing regions includes means for varying the thickness of said active layer, to provide corresponding variations in the effective refractive index and the longitudinal mode spacing.

3. A semiconductor laser structure as set forth in claim 2, wherein said means defining principal lasing regions and an intermediate coupling region include:
  a semiconductor substrate having said two parallel channels formed therein;
  a first inactive semiconductor layer of selected polarity type formed over said substrate;
  a second inactive semiconductor layer of opposite polarity type to the first formed over said active layer, which is itself formed over said first inactive layer;
  a top semiconductor layer formed over said second inactive layer; and
  a conductive diffusion region extending through said top layer and into said second inactive layer, and extending laterally across both of said channels.

4. A semiconductor laser as set forth in claim 3, wherein:
  said substrate is of n type gallium arsenide (GaAs);
  said first and second inactive layers are of n type and p type, respectively, gallium aluminum arsenide of approximately the composition $Ga_{0.65}Al_{0.35}As$;
  said active layer is of gallium aluminum arsenide of approximately the composition $Ga_{0.94}Al_{0.06}As$; and
  said top layer is of n type gallium arsenide.

5. A semiconductor diode laser structure operable at high power and brightness levels and having a desirable far-field radiation distribution pattern, said laser structure comprising:
  first and second inactive cladding semiconductor layers of opposite polarity types;
  an active semiconductor layer disposed between said first and second inactive layers;
  means defining at least two principal lasing regions in said active layer, said means defining the principal lasing regions including a semiconductor substrate on which the structure is formed and two laser channels formed in said substrate, to confine the lasing action in the principal lasing regions, located adjacent to the channels, the principal lasing regions being laterally spaced and in close enough proximity to provide close coupling between the regions;
  means defining an intermediate region between said laser channels, wherein the thickness of said first inactive layer, between said active semiconductor layer and said substrate, is large enough to reduce absorption losses sufficiently to result in optical gain between the principal lasing regions; and
  means for applying a bias voltage across said inactive layers in the principal lasing regions and in the intermediate region, to produce reduced absorption losses and optical gain in the intermediate region.

6. A semiconductor laser diode structure as set forth in claim 5, wherein:
  the principal lasing region and intermediate regions are of such width as to result in a single lasing filament in each region.

7. A semiconductor laser diode structure as set forth in claim 5, wherein:
  said means defining the intermediate region includes a substrate mesa between said channels, dimensioned to provide optical gain in the intermediate region.

8. A semiconductor laser diode structure as set forth in claim 7, wherein:
  the thickness of said first inactive layer between said substrate mesa and said active layer is large enough to reduce absorption losses in the intermediate region to such a degree that there is a net optical gain in the region.

9. A semiconductor laser diode structure as set forth in claim 5, wherein:
  said structure further includes a top semiconductor layer; and
  said means for applying a bias voltage includes a deep diffusion region of zinc extending through said top layer and into said second inactive layer, and extending laterally across said substrate channels and the intermediate channel region.

10. A semiconductor laser structure operating at high power and brightness levels and having a desirable far-field single lobe radiation distribution pattern, said structure comprising:
  a semiconductor substrate having at least two parallel channels formed therein;
  a first inactive semiconductor layer of a selected polarity type formed over said substrate;
  an active semiconductor layer formed over said first inactive layer;
  a second inactive semiconductor layer of the opposite polarity type to the first, formed over said active layer;
  a top semiconductor layer formed over said second inactive layer; and
  a deep zinc diffusion region extending through said top layer and partially into said second inactive layer, said zinc diffusion region extending laterally across both channels in one continuous stripe;
  wherein the width and spacing of said channels define a single-filament lasing region adjacent to each channel and an intermediate region having optical gain between said channels, when a bias voltage is applied between said substrate and said zinc diffusion region;
  and wherein the thickness of said first inactive layer in the intermediate region is sufficiently great to reduce absorption losses in the region to a point at which there is close coupling between channels and optical gain in the intermediate region.

11. A semiconductor laser diode structure as set forth in claim 10, wherein:
  the thickness of said first inactive layer is greater in the region between channels that it is in areas outside said channels, to provide for optical gain in the region between channels, and yet to contain lasing within the channel regions.

12. A semiconductor laser diode structure as set forth in claim 11, wherein:
  said first inactive layer is formed by liquid-phase epitaxy, and the substrate region between channels is melted back to a lower height during the liquid-phase epitaxy process, thereby producing the desired increased thickness of said first inactive layer in the intermediate region.

13. A semiconductor laser diode structure as set forth in claim 10, wherein:
  said substrate is of n type gallium arsenide (GaAs);
  said first and second inactive layers are of n type and p type, respectively, gallium aluminum arsenide of approximately the composition $Ga_{0.65}Al_{0.35}As$;

said active layer is of gallium aluminum arsenide of approximately the composition $Ga_{0.94}Al_{0.06}As$; and said top layer is of n type gallium arsenide.

14. A semiconductor laser diode structure as set forth in claim 13, wherein:
said channels have a width in the range 4-8 microns each and a center-to-center spacing in the range 8-16 microns.

15. A semiconductor laser diode structure as set forth in claim 14, wherein:
the thickness of said first inactive layer in the region between channels is sufficiently large to ensure a net optical gain in the intermediate region between channels.

16. A semiconductor laser diode structure as set forth in claim 15, wherein:
said active layer has a thickness in the range 600-1,000 Angstroms;
the thickness of said first inactive layer in the region between channels is greater than 0.6 micron.

17. A semiconductor laser diode structure as set forth in claim 16, wherein:
the thickness of said first inactive layer is greater in the region between channels that it is in areas outside said channels, to provide for optical gain in the region between channels, and yet to contain lasing within the channel regions.

18. A semiconductor laser diode structure as set forth in claim 17, wherein:
said first inactive layer is formed by liquid-phase epitaxy, and the substrate region between channels is melted back to a lower height during the liquid-phase epitaxy process, thereby producing the desired increased thickness of said first inactive layer in the intermediate region between channels.

19. A semiconductor laser diode structure as set forth in claim 18, wherein
the substrate region between channels is melted back by approximately 0.3-1.0 micron.

20. A gallium arsenide semiconductor laser having high power and brightness levels and a single-lobe far-field radiation distribution pattern, said laser comprising:
a semiconductor substrate of n type gallium arsenide having at least two parallel channels formed therein;
a first inactive semiconductor layer of n type gallium aluminum arsenide of approximately the composition $Ga_{0.65}Al_{0.35}As$ formed over said substrate;
an active semiconductor layer of gallium aluminum arsenide of approximately the composition $Ga_{0.94}Al_{0.06}As$ formed over said first inactive layer;
a second inactive semiconductor layer of p type gallium aluminum arsenide of approximately the composition $Ga_{0.65}Al_{0.35}As$ formed over said active layer;
a top semiconductor layer of n type gallium arsenide formed over said second inactive layer; and
a deep zinc diffusion region extending through said top layer and partially into said second inactive layer, said zinc diffusion region extending laterally across both said channels in one continuous stripe;
wherein the width and spacing of said channels is selected to provide a single-filament lasing region adjacent to each channel and a single-filament region having optical gain between said channels, when a bias voltage is applied between said substrate and said zinc diffusion region;
and wherein the thickness of said first inactive layer in the region between said channels is sufficiently great to reduce absorption losses in the region to a point at which there is a net optical gain in the intermediate region.

21. A gallium arsenide semiconductor laser as set forth in claim 20, wherein:
said substrate channels have a depth of approximately 1.5 microns, a width of approximately 4-8 microns and are spaced apart by approximately 4-8 microns;
said first inactive layer is approximately 0.9 micron thick;
said active layer is approximately 600-1,000 Angstroms thick; and
said second inactive layer is approximately 1.8 microns thick.

22. A gallium arsenide semiconductor laser as set forth in claim 21, wherein:
said first inactive layer is thicker in the region between said channels than in areas outside said channels, to promote lasing with a net optical gain within the intermediate region between channels, but to contain principal lasing regions in the channel regions.

23. A gallium arsenide semiconductor laser having high power and brightness levels and a single-lobe far-field radiation distribution pattern, said laser comprising:
a semiconductor substrate of n type gallium arsenide having at least two parallel channels formed therein;
a first inactive semiconductor layer of n type gallium aluminum arsenide of approximately the composition $Ga_{0.65}Al_{0.35}As$ formed over said substrate;
an active semiconductor layer of gallium aluminum arsenide of approximately the composition $Ga_{0.94}Al_{0.06}As$ formed over said first inactive layer;
a second inactive semiconductor layer of p type gallium aluminum arsenide of approximately the composition $Ga_{0.65}Al_{0.35}As$ formed over said active layer;
a top semiconductor layer of n type gallium arsenide formed over said second inactive layer; and
a deep zinc diffusion region extending through said top layer and partially into said second inactive layer, said zinc diffusion region extending laterally across both channels in one continuous stripe;
wherein the width and spacing of said channels is selected to provide a single-filament lasing region adjacent to each channel and an intermediate region of reduced absorption losses between said channels, when a bias voltage is applied between said substrate and said zinc diffusion region;
and wherein the thickness of said first inactive layer in the intermediate region is sufficiently great to reduce absorption losses to a point at which there is optical gain in the intermediate region and close coupling between the channels.

24. A gallium arsenide semiconductor laser as set forth in claim 23, wherein:
said substrate channels have a depth of approximately 1.5 microns, a width of approximately 4-8 microns and are spaced apart by approximately 4-8 microns;
said first inactive layer is approximately 0.9 micron thick;
said active layer is approximately 600-1,000 Angstroms thick; and
said second inactive layer is approximately 1.8 microns thick.

* * * * *